United States Patent
Restaino et al.

(10) Patent No.: US 7,407,605 B2
(45) Date of Patent: Aug. 5, 2008

(54) MANUFACTURABLE COWP METAL CAP PROCESS FOR COPPER INTERCONNECTS

(75) Inventors: Darryl D. Restaino, Modena, NY (US); Donald F. Canaperi, Bridgewater, CT (US); Judith M. Rubino, Ossining, NY (US); Sean P. E. Smith, Hopewell Junction, NY (US); Richard O. Henry, Wappingers Falls, NY (US); James E. Fluegel, Rhinebeck, NY (US); Mahadevaiyer Krishnan, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/751,788

(22) Filed: May 22, 2007

(65) Prior Publication Data

US 2007/0215842 A1 Sep. 20, 2007

Related U.S. Application Data

(62) Division of application No. 10/905,230, filed on Dec. 22, 2004, now Pat. No. 7,253,106.

(51) Int. Cl.
H01B 1/00 (2006.01)

(52) U.S. Cl. .................. 252/519.2; 252/521.6; 423/22; 423/491

(58) Field of Classification Search .................. 252/514, 252/519.2, 519.21, 521.6; 106/1.28; 423/22, 423/491
See application file for complete search history.

(56) References Cited

U.S. PATENT DOCUMENTS

| 4,622,069 | A | 11/1986 | Akai et al. |
| 4,956,197 | A | 9/1990 | Babu et al. |
| 5,695,810 | A | 12/1997 | Dubin et al. |
| 5,882,736 | A | 3/1999 | Stein et al. |
| 6,153,935 | A | 11/2000 | Edelstein et al. |
| 6,323,128 | B1 | 11/2001 | Sambucetti et al. |
| 6,495,200 | B1 | 12/2002 | Chan et al. |
| 6,551,860 | B2 | 4/2003 | Uner et al. |
| 6,592,677 | B1 | 7/2003 | Tomimori et al. |
| 6,794,288 | B1 | 9/2004 | Kolics et al. |
| 6,797,312 | B2 | 9/2004 | Kong et al. |
| 6,987,200 | B2 * | 1/2006 | Hagemeyer et al. ......... 560/261 |
| 2003/0235658 | A1 | 12/2003 | Shacham-Diamand et al. |
| 2005/0087141 | A1 | 4/2005 | Honda et al. |
| 2005/0885031 | | 4/2005 | Lopatin et al. |
| 2005/0101130 | A1 | 5/2005 | Lopatin et al. |
| 2005/0161338 | A1 | 7/2005 | Fang et al. |
| 2005/0170650 | A1 | 8/2005 | Fang et al. |
| 2005/0192176 | A1 | 9/2005 | Obayashi et al. |

* cited by examiner

Primary Examiner—Mark Kopec
(74) Attorney, Agent, or Firm—Lisa U. Jaklitsch

(57) ABSTRACT

An aqueous seeding solution of palladium acetate, acetic acid and chloride.

3 Claims, 2 Drawing Sheets

MANUFACTURABLE COWP METAL CAP PROCESS FOR COPPER INTERCONNECTS

CROSS-REFERENCE TO RELATED APPLICATION

This application is a DIV of Ser. No. 10/905,230 (filed Dec. 22, 2004, now U.S. Pat. No. 7,253,106).

BACKGROUND OF THE INVENTION

The present invention relates to the formation of a cobalt/tungsten/phosphorus (CoWP) metal cap for a copper interconnect and, more particularly relates to a manufacturable process for the formation of the CoWP metal cap on such copper interconnect.

Metallization patterns on integrated circuits can be formed by depositing a dielectric layer, patterning the dielectric layer to form a trench and then depositing a metal layer that fills the trench in the dielectric layer. The metal layer typically not only fills the trenches but also covers the entire semiconductor wafer. Therefore, the excess metal is removed using either chemical-mechanical polishing (CMP) or an etchback process so that only the metal in the trenches remains.

As wire widths in integrated circuits continue to shrink, the electrical conductivity of the wiring material becomes increasingly more important. The material of choice, aluminum, is becoming less attractive than other materials, such as copper, which are better conductors. In addition to possessing superior electrical conductivity, copper is more resistant than aluminum to electromigration, a property that increases in importance as wire cross-sectional areas decrease and applied current densities increase. Copper is seen as an attractive replacement for aluminum because copper offers low cost, ease of processing, lower susceptibility to electromigration, and lower resistivity.

Copper has several serious disadvantages as a wiring material. It can diffuse rapidly into and through silicon substrates and dielectric films, such as silicon dioxide. Diffusion into an adjacent dielectric region can cause formation of a conductive path between two interconnect lines producing an electrical short. Diffusion into an adjacent silicon substrate can cause junction leakage, thereby destroying the device. Copper also has poor adhesion to the dielectric capping layer. Replacement of aluminum with copper as an interconnect material requires that these problems be overcome.

To alleviate the problem of copper adhering to the overlying dielectric capping layer, various metal caps have been proposed to cap the copper interconnect so as to increase adhesion to the overlying dielectric capping layer. One such proposed metal capping material is CoWP. Dubin et al. U.S. Pat. No. 5,695,810, Edelstein et al. U.S. Pat. No. 6,153,935 and Sambucetti et al. U.S. Pat. No. 6,323,128, the disclosures of which are incorporated by reference herein, all disclose the electroless deposition of CoWP. In Dubin et al., electrolessly plated CoWP is used as a barrier layer between the copper and the dielectric. Dubin et al. further discloses that a palladium (Pd) seed is sputtered on the dielectric for adhesion of the CoWP but no seed is deposited on the copper when the CoWP is used as a metal cap.

In Edelstein et al., a Pd seed is formed on the copper wiring material by a Pd solution of undisclosed composition prior to electroless deposition of the CoWP. Residual Pd seed (not adhered to the copper) is removed by an aqueous solution of a strong complexing agent such as ethylenediamine, citrate, or ethylenediamine tetraacetic acid.

In Sambucetti et al., copper wiring material is pretreated with $H_2SO_4$ followed by treatment with a Pd solution of undisclosed composition to cause deposition of a Pd seed followed by a solution containing at least 15 g/l of sodium citrate or ethylenediamine tetraacetic acid to remove excess Pd ions. The copper wiring material is then electrolessly plated with CoWP.

Babu et al. U.S. Pat. No. 4,956,197, the disclosure of which is incorporated by reference herein, discloses the electroless plating of nickel or copper onto a dielectric substrate. The dielectric substrate is pretreated with an $NH_3$ plasma followed by treatment with a $PdCl_2$ seeding solution containing HCl. The $PdCl_2$ is an extremely aggressive seeding solution and is unacceptable for the copper interconnects of the present invention.

Akai et al. U.S. Pat. No. 4,622,069, the disclosure of which is incorporated by reference herein, discloses the electroless plating of nickel or copper onto a ceramic substrate. Prior to electroless plating, the ceramic substrate was treated with an organic Pd seed solution to deposit a Pd seed.

Notwithstanding the efforts of those skilled in the art, there remains a need for a manufacturable process for depositing a CoWP capping layer for a copper interconnect.

Accordingly, it is an object of the present invention to have a process for depositing a CoWP capping layer for a copper interconnect which is well-controlled and repeatable.

It is another object of the present invention to have a process for depositing a CoWP capping layer for a copper interconnect using a Pd seed solution which enables robust seeding for CoWP while minimizing chemical attack of the copper interconnect.

These and other objects of the invention will become more apparent after referring to the following description of the invention.

BRIEF SUMMARY OF THE INVENTION

The object of the invention have been achieved by providing a seeding solution for depositing a palladium seed on copper comprising an aqueous solution of palladium acetate, acetate and chloride.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
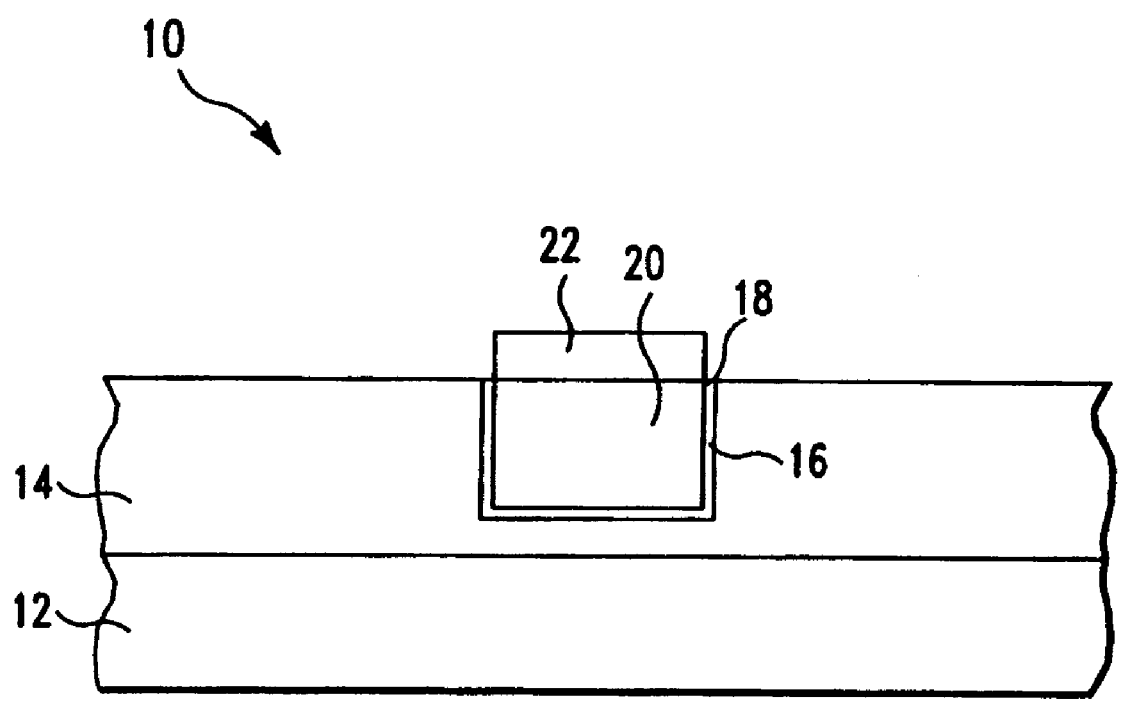
FIG. 1 is a schematical representation of a copper interconnect illustration a preferred embodiment of the present invention.

Referring to the Figures in more detail, and particularly referring to FIG. 1, there is shown an article 10 which is exemplary of a preferred embodiment of the present invention. The article 10 comprises a substrate 12, preferably a semiconductor substrate and, most preferably, a semiconductor wafer. The semiconductor wafer can be made of any semiconductor material such as silicon, silicon germanium or gallium arsenide, just to name a few. The substrate 12 may have electrical circuitry and other features which are not germane to the present invention. Over the substrate 12 is formed a layer 14 which is preferably an insulating layer and, most preferably, is a dielectric layer such as an oxide (e.g, silicon dioxide). Within layer 14 is formed a trench 16 which holds the copper 20. If the article 10 is used for electronic applications, it may be necessary to form a liner 18 between the copper 20 and layer (e.g., dielectric) 14. The liner is conventional and may be formed of a CoWP alloy but more usually is formed of a bilayer of TaN (tantalum nitride) and Ta (tantalum). Lastly, the article 10 comprises a layer of CoWP 22 which has been electrolessly plated on the copper 20. Not shown in FIG. 1 is the Pd which is conventionally used to "seed" the copper so that the CoWP can be effectively and uniformly deposited. If there is a liner, the liner typically will not be seeded or plated.

Others have proposed Pd seeding as a precursor to the electroless plating of CoWP. However, the prior art solutions proposed by others have been found to be unsuitable for use in manufacturing where a repeatable process is absolutely necessary. This is particularly the case in the electronics industry where the copper wiring is very small (on the order of 90 nm in current state of the art semiconductor manufacturing).

The present inventors have set forth an electroless plating process which is less aggressive towards the copper and minimizes colloids which can cause stray plating of the CoWP on non-copper surfaces.

According to the present invention, there is disclosed a process for electrolessly plating on copper that is contained in or on a substrate. That is, the copper may be in a trench, as shown in FIG. 1, or may be simply on the surface of a substrate. In the most preferred embodiment of the present invention, the substrate is a semiconductor wafer.

In the first step of the inventive process, the copper surface may be optionally precleaned to remove any residues from pervious processing operations. For example, when the substrate is a semiconductor wafer, it may have undergone chemical-mechanical polishing which leaves a passivating layer of BTA (benzotriazole). In this case, it may be desirable to preclean the copper to remove the BTA or other residue. Two precleaning subprocesses have been proposed by the present inventors. In the first precleaning subprocess, the article 10 is heated to 100° C. in nitrogen for a predetermined period of time (e.g., 30 to 120 minutes) followed by application of an oxalic acid solution, preferably 5 grams (g)/liter (l) to the article 10. This process is preferred when there is a residue that is susceptible to be baked off, as is the case with BTA. In an alternative subprocess, the oxalic acid may be applied without the necessity of the nitrogen bake. The oxalic acid is useful for removing any copper oxide present on the copper as well as removing any copper particles which may be present on the non-copper regions of the article 10. The oxalic acid may be applied by spraying onto the article 10 or simply immersing the article 10 in an oxalic acid bath.

In the next step of the process, an aqueous Pd seeding solution is applied to the article 10. The seeding solution may be applied by spraying or immersion and is usually done at room temperature. The inventive Pd seeding solution according to the present invention comprises the active ingredients of palladium acetate, acetic acid and a chloride (i.e., a chloride-containing component) in a water solution. The present inventors have found that a small but effective amount of chloride leads to a repeatable process wherein there is effective seeding with a low increase in resistance of the copper lines (Rs). Conventional Pd seeding solutions comprise palladium chloride or palladium sulfate. However, such seeding solutions are too aggressive with respect to the copper, particularly when the copper is used in electronic applications. If the Pd seeding solution is too aggressive, too much of the copper will be etched, thereby adversely increasing the resistance of the remaining copper. Too, the pH of the Pd seeding solution is such that undesirable colloidal formation is minimized.

A preferred Pd seeding solution comprises about 0.01 to 0.5 g/l palladium acetate, 0.25 to 5 volume percent acetic acid and 3 to 10 ppm chloride and most preferably, 0.01 g/l palladium acetate, 0.25 to 1 volume percent acetic acid and 3 to 10 ppm chloride. the chloride is actually added as a compound in which the chloride component of the compound is donated to the seeding reaction. Examples of suitable chloride compounds include but are not limited to hydrochloric acid (HCl), sodium chloride (NaCl), potassium chloride (KCl), ammonium chloride ($NH_4Cl$) and palladium chloride ($PdCl_2$) with hydrochloric acid being the most preferred. While $PdCl_2$ may be used as the chloride, it should be understood that the Pd donated to the seeding reaction is very small and the bulk of the Pd comes from the Pd acetate. $PdCl_2$, as noted previously, is not to be used as the primary supplier of the Pd because the seeding is too aggressive and can damage the copper wiring.

The amount of chloride must be tightly controlled in order to have a reproducible, and thus manufacturable, process. The amounts of palladium acetate and acetic acid have a wider range of concentration. If the palladium acetate is reduced below about 0.01 g/l, Pd seeding becomes difficult while if the palladium acetate is raised above 0.05 g/l, the resistance of the copper lines is adversely affected in addition to the seed becoming increasingly unstable due to palladium colloid formation. Lowering the acetic acid to the lowest value, 0.25 volume percent and most preferably 1 volume percent, results in the highest seeding yields. If the acetic acid is reduced below about 0.25 volume percent, the Pd is not dissolved into solution and seeding is adversely affected. Higher acetic acid concentrations beyond 5 volume percent hinder the Pd seeding thereby making it difficult to effectively seed the copper. The relatively small addition of chloride is critical to the success of the Pd seeding solution. The preferred range of the chloride is 3 to 10 parts per million (ppm) with the lower end of the range being preferred for spraying of the Pd seeding solution and the upper end of the range being preferred for immersion of the article 10 in the Pd seeding solution. It has been found that if the chloride is lowered too much (e.g., below about 2.5 ppm if Pd acetate is about 0.01 g/l and acetic acid is about 0.25 volume percent), there is ineffective seeding while if the chloride is raised too high (e.g., above 10 ppm if Pd acetate is 0.01 g/l and acetic acid is 1 volume percent), the Pd seeding solution becomes too aggressive and increases the resistance of the copper. Generally speaking, the pH should be in the range of 2.3 to 3.65, and most preferably less than 3 palladium colloid prevention and effective seeding.

Even with the above components within the claimed range, adjustments may be need to be made in the concentrations of each of the components with respect to each other to ensure good seeding with no adverse impact on the Rs. If the Pd acetate concentration is on the high end of its concentration range, the chloride should be on the lower end of its range, otherwise there will be an increase in Rs. For acetic acid, higher concentrations of acetic acid hinder effective seeding and require high concentrations of Pd acetate and chloride. As soon as one of the components (Pd acetate, acetic acid, chloride) is raised or lowered outside of the claimed ranges, it becomes difficult to impossible to alter the other components to ensure good seeding and good Rs.

Figure 2:
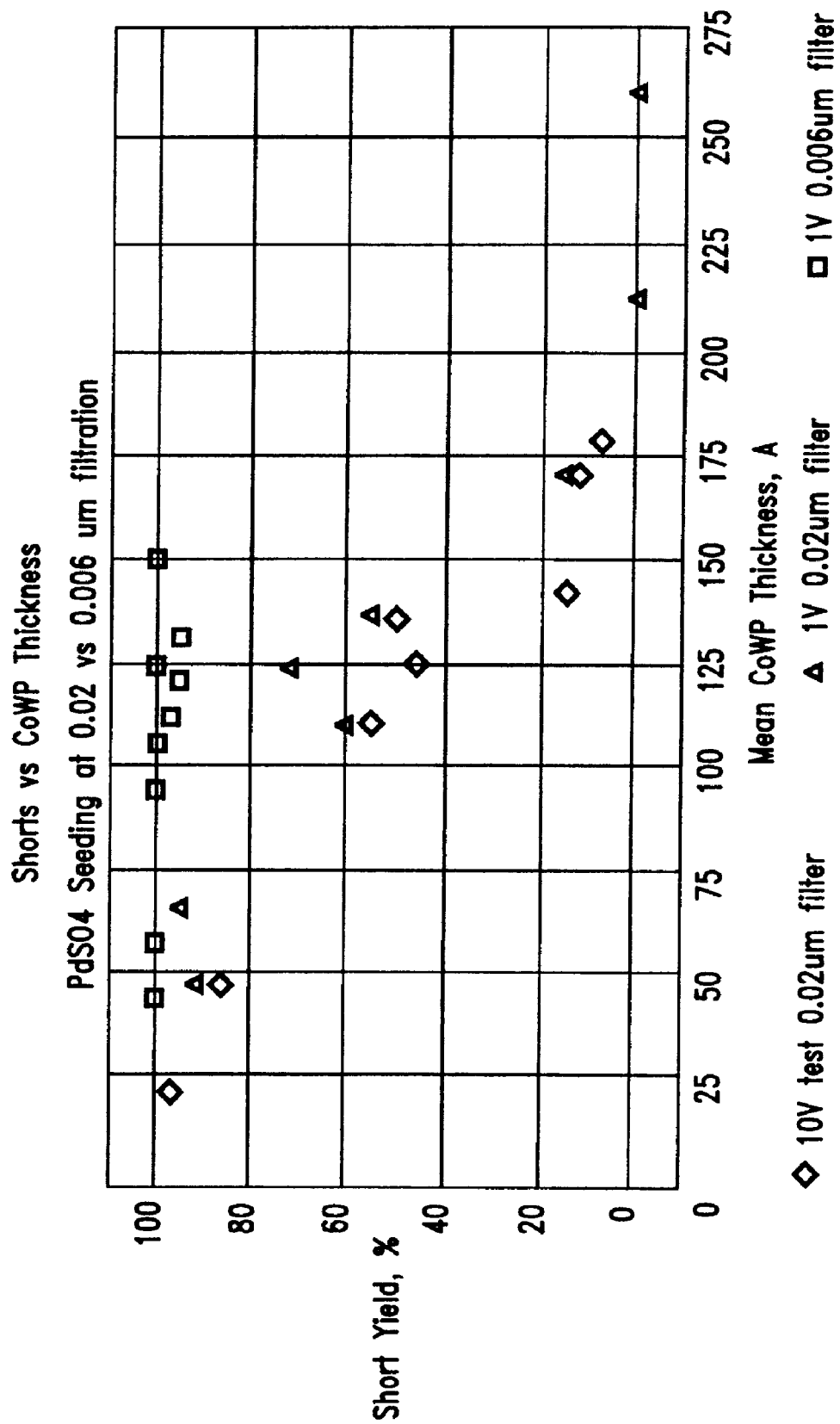
FIG. 2 is a graph illustrating the efficacy of a gas filter to filter colloidal particles from the seeding bath.

The present inventors have further found that notwithstanding the control of the Pd seeding bath as discussed above, colloidal particles will form. Such colloidal particles are undesirable in that they form unwanted sites where CoWP may form. Accordingly, the present inventors cause the Pd seeding solution to be circulated through a gas filter, preferably with a pore size no larger than 0.006 um, which effectively filters out the vast majority of colloidal particles. Referring to FIG. 2, a gas filter having a pore size of 0.02 um or 0.006 um was utilized during a Pd seeding step in which Pd sulfate was used as the seeding solution. The seeded samples were then plated with CoWP and the resulting yield determined as measured by the shorts present. (A short would form because CoWP would plate on the colloidal particles, if any, between the copper lines causing a short between the copper lines as more CoWP was plated.) As can be seen, the yield for the 0.02 um filters started to drop once the CoWP thickness got to around 75 angstroms. On the other hand, the yield for the 0.006 um filter unexpectedly allowed CoWP plating up to 150 angstroms without a drop in yield. For the latter samples, plating was discontinued at 150 angstroms. Even though the graph shows results using a Pd sulfate seeding solution, equivalent results can be expected using the Pd acetate seeding solution of the present invention.

During the foregoing seeding step, scattered Pd ions are likely to be adsorbed on non-copper surfaces. The adsorbed Pd ions are undesirable in that they provide nucleation sites for the electroless deposition of CoWP at locations other than on the copper and thus are to be avoided. To remove such adsorbed Pd ions, a complexation solution is applied (e.g., by spraying or immersion) to the article 10 to remove the adsorbed Pd ions. Preferably, the complexation solution comprises sodium citrate or ethylenediamine tetraacetic acid (EDTA) in the amount of 25 g/l. The complexation solution is preferably applied at room temperature.

The last step of the process according to the present invention is to electrolessly plate the copper with a plating solution comprising cobalt, tungsten and phosphorus so as to result in the deposition of CoWP layer on to the copper. The plating solution may be sprayed on the article 10 or the article 10 may be immersed in the plating solution. the plating solution used comprised 6 g/l cobalt sulfate, 25 g/l sodium citrate, 30 g/l boric acid, 8 g/l sodium hypophosphate, 2.5 g/l ammonium tungstate and 0.05 g/l of a surfactant such as L95, available from Dow Chemical, Midland, Mich. The pH of the plating solution was adjusted to 8.95 using sodium hydroxide and the temperature of the plating solution was 73° C.

EXAMPLES

The advantages of the invention will become more apparent after referring to the following examples.

A series of samples were prepared. Each sample was seeded using an aqueous seeding solution comprising Pd acetate, acetic acid, hydrochloric acid and water but the amount of each of the Pd acetate, acetic acid and hydrochloric acid was varied as noted in the table. Some of the samples were immersed in the seeding solution while others were sprayed with the seeding solution. Then, each sample was exposed to a complexation solution to remove adsorbed Pd ions and then electrolessly plated with a CoWP plating solution. the results are indicated in the table.

| Sample No. | Pd Acetate g/l | Acetic Acid volume % | HCL ppm | Spray (S) or Immersion (I) | Results |
|---|---|---|---|---|---|
| 1 | 0.005 | 1 | 3 | S | Ineffective seeding |
| 2 | 0.01 | 0.25 | 2 | S | Ineffective seeding |
| 3 | 0.01 | 0.25 | 3 | S | Good seeding, low increase in Rs |
| 4 | 0.01 | 0.25 | 5 | S | Good seeding, low increase in Rs |
| 5 | 0.01 | 0.25 | 10 | S | Good seeding, increase in Rs |
| 6 | 0.01 | 1 | 3 | S | Good seeding, low increase in Rs |
| 7 | 0.01 | 1 | 3 | I | Good seeding, low increase in Rs |
| 8 | 0.01 | 1 | 5 | S | Good seeding, low increase in Rs |
| 9 | 0.01 | 1 | 5 | I | Good seeding, low increase in Rs |
| 10 | 0.01 | 1 | 10 | S | Good seeding, increase in Rs |
| 11 | 0.01 | 1 | 10 | I | Good seeding, low Rs |
| 12 | 0.01 | 5 | 10 | S | Ineffective seeding |
| 13 | 0.01 | 5 | 20 | S | Increase in Rs |
| 14 | 0.05 | 1 | 3 | S | Good seeding |
| 15 | 0.05 | 1 | 5 | S | Increase in Rs |
| 16 | 0.07 | 1 | 3 | S | Increase in Rs |

The above examples illustrate the effectiveness of the claimed ranges of the seeding solution of the present invention as well as the interdependence of each component of the seeding solution.

In Examples 1 and 2, either the Pd acetate or hydrochloric acid were too low, resulting in ineffective seeding. Examples 3 to 11 and 14 were within the preferred ranges and produced good results. With respect to Examples 5 and 10, while there was good seeding, the hydrochloric acid was a little high for a spray application, thereby resulting in an increase in Rs. Were the seeding to be applied by immersion, there would still be good seeding with a lower increase in Rs.

While Example 12 was within the preferred range, there was ineffective seeding. This is due to the higher concentration of acetic acid. the higher concentration of acetic acid hinders effective seeding and requires higher concentrations in the Pd acetate and/or hydrochloric acid. However, at much higher concentrations of hydrochloric acid, such as the 20 ppm shown in Example 13, there is better seeding but a high Rs.

Examples 15 and 16 both result in high Rs, although Example 15 is within the preferred range. Since the Pd acetate is at the high end of its concentration range, the hydrochloric acid should be at the lower end of its range, at least less than 5 ppm. On the other hand, when the Pd acetate is out of the high end of the preferred range, there is high Rs even for very low concentration of hydrochloric acid as illustrated by Example 16.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A seeding solution for depositing a palladium seed on copper comprising an aqueous solution of palladium acetate, acetic acid, and hydrochloric acid.

2. The seeding solution of claim 1 wherein the aqueous solution of palladium acetate, acetic acid, and chloride comprises 0.01 g/l palladium acetate, 0.25 to 5 volume percent acetic acid and 3 to 10 ppm hydrochloric acid.

3. The seeding solution of claim 1 wherein the aqueous solution of palladium acetate, acetic acid, and chloride comprises 0.01 g/l palladium acetate, 0.25 to 1 volume percent acetic acid and 3 to 10 ppm hydrochloric acid.

\* \* \* \* \*